(12) United States Patent
Cheng

(10) Patent No.: US 12,527,007 B2
(45) Date of Patent: Jan. 13, 2026

(54) PHASE CHANGE MEMORY WITH IMPROVED RECOVERY FROM ELEMENT SEGREGATION

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/062,067

(22) Filed: Dec. 6, 2022

(65) Prior Publication Data

US 2023/0096174 A1    Mar. 30, 2023

Related U.S. Application Data

(62) Division of application No. 16/135,595, filed on Sep. 19, 2018, now Pat. No. 11,587,978.

(51) Int. Cl.
*H10B 63/00*    (2023.01)
*H10N 70/00*    (2023.01)
*H10N 70/20*    (2023.01)
*G11C 13/00*    (2006.01)

(52) U.S. Cl.
CPC .......... *H10B 63/84* (2023.02); *H10N 70/023* (2023.02); *H10N 70/231* (2023.02); *H10N 70/8828* (2023.02); *G11C 13/0097* (2013.01)

(58) Field of Classification Search
CPC ...... H01L 27/24; H01L 27/2481; H10B 63/84
See application file for complete search history.

(56) References Cited

U.S. PATENT DOCUMENTS

| 8,105,859 | B2 | 1/2012 | Breitwisch et al. |
| 8,330,137 | B2 | 12/2012 | Schroot et al. |
| 8,884,260 | B2 | 11/2014 | Chen et al. |
| 9,299,930 | B2 | 3/2016 | Redaelli et al. |
| 9,659,998 | B1 * | 5/2017 | Lung ................... H10N 70/021 |
| 2005/0112896 | A1 * | 5/2005 | Hamann ............... H10B 63/80 |
| | | | 438/694 |

(Continued)

FOREIGN PATENT DOCUMENTS

WO    2018125244 A1    7/2018

OTHER PUBLICATIONS

List of IBM Patents or Patent Applications Treated as Related dated Dec. 6, 2022, 2 pages.

(Continued)

*Primary Examiner* — Trang Q Tran
(74) *Attorney, Agent, or Firm* — Tutunjian & Bitetto, P.C.; Samuel Waldbaum

(57) ABSTRACT

A method is presented for reducing element segregation of a phase change material (PCM). The method includes forming a bottom electrode, constructing a layered stack over the bottom electrode, the layered stack including the PCM separated by one or more electrically conductive and chemically stable materials, and forming a top electrode over the layered stack. The PCM is Ge—Sb—Te (germanium-antimony-tellurium or GST) and the one or more electrically conductive and chemically stable materials are titanium nitride (TiN) segments.

19 Claims, 4 Drawing Sheets

(56) References Cited

U.S. PATENT DOCUMENTS

| | | | |
|---|---|---|---|
| 2006/0266992 | A1 | 11/2006 | Matsui et al. |
| 2008/0248632 | A1* | 10/2008 | Youn .................... H10N 70/231 |
| | | | 438/483 |
| 2010/0213433 | A1* | 8/2010 | Yamamoto ............ H01L 27/101 |
| | | | 257/E47.001 |
| 2012/0294072 | A1 | 11/2012 | Loke et al. |
| 2013/0171741 | A1* | 7/2013 | Hwang ................ H10N 70/063 |
| | | | 257/E43.006 |
| 2018/0158870 | A1 | 6/2018 | Apodaca et al. |

OTHER PUBLICATIONS

Battaglia et al., "Effect of a thin Ti interfacial layer on the thermal resistance of Ge2Sb2Te5—TiN stack", Applied Physics Letters. vol. 105. Issue 12. Sep. 23, 2014. pp. 1-7.

Bozorg-Grayeli et al., "Thermal Conductivity and Boundary Resistance Measurements of GeSbTe and Electrode Materials Using Nanosecond Thermoreflectance", 2010 12th IEEE Intersociety Conference on Thermal and Thermomechanical Phenomena in Electronic Systems. Jun. 2-5, 2010. pp. 1-7.

Rajendran et al., "On the Dynamic Resistance and Reliability of Phase Change Memory", 2008 Symposium on VLSI Technology Digest of Technical Papers. Jun. 17-19, 2008. pp. 96-97.

Yang et al., "Atomic migration in molten and crystalline Ge2Sb2Te5 under high electric field", Applied Physics Letters. vol. 95. Issue 3. Jul. 20, 2009. pp. 1-4.

\* cited by examiner

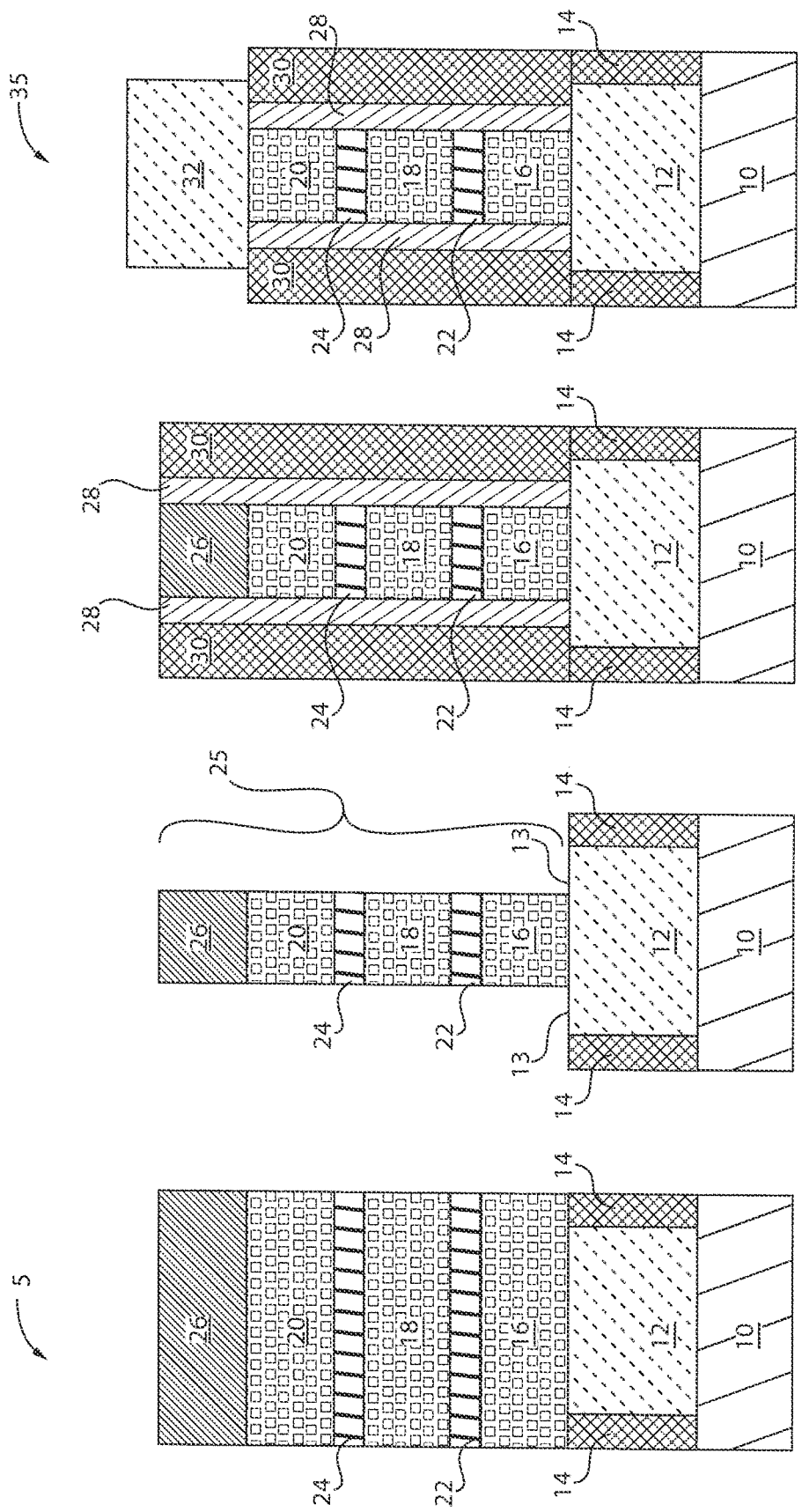

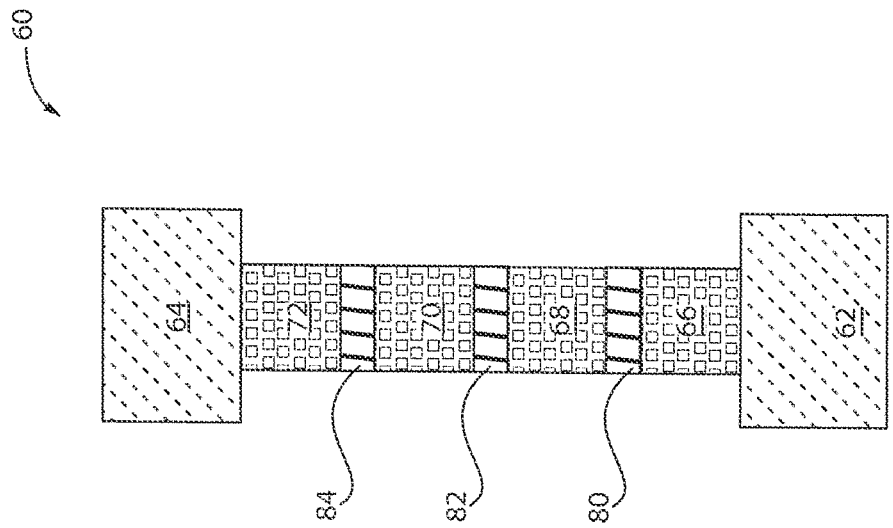
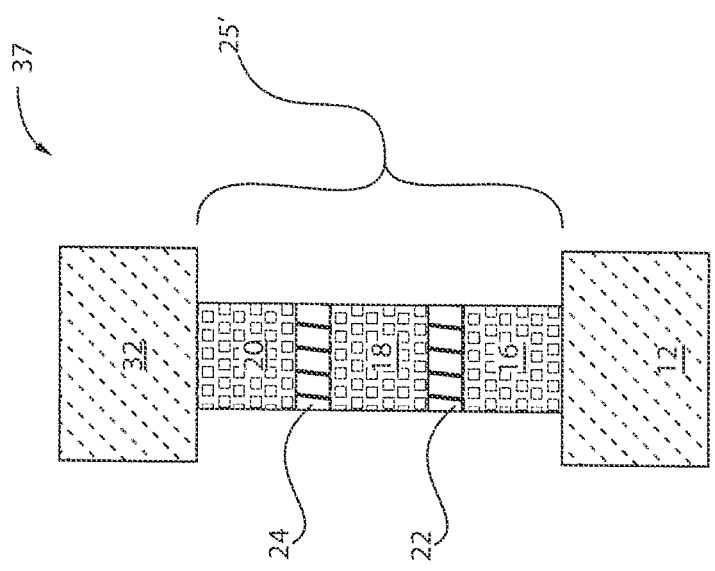

PHASE CHANGE MEMORY WITH IMPROVED RECOVERY FROM ELEMENT SEGREGATION

BACKGROUND

Technical Field

The present invention relates generally to semiconductor devices, and more specifically, to phase change memory with improved recovery from element segregation.

Description of the Related Art

A phase change memory is one of next-generation non-volatile memory devices that are expected to meet an increasing demand for a high-performance and low-power semiconductor memory device. In phase change memory devices, data can be stored or erased by heating or cooling a phase change layer therein. However, element segregation can occur during phase-change memory operation.

SUMMARY

In accordance with an embodiment, a method is provided for reducing element segregation of a phase change element. The method includes forming a bottom electrode, constructing a layered stack over the bottom electrode, the layered stack including the PCM separated by one or more electrically conductive and chemically stable materials, and forming a top electrode over the layered stack.

In accordance with another embodiment, a method is provided for reducing element segregation of a phase change element. The method includes incorporating a PCM cell within a crossbar array, the PCM cell constructed by forming a bottom electrode over a substrate, forming a stack over the bottom electrode, the stack including alternating layers of the PCM and electrically conductive and chemically stable materials, and forming a top electrode over the stack.

In accordance with yet another embodiment, a semiconductor device is provided for reducing element segregation of a phase change element. The semiconductor device includes a bottom electrode, a layered stack disposed over the bottom electrode, the layered stack including the PCM separated by one or more electrically conductive and chemically stable materials, and a top electrode disposed over the layered stack.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including a bottom electrode formed on a substrate and a layered stack formed over the bottom electrode, in accordance with an embodiment of the present invention;

FIG. 2 is a cross-sectional view of the semiconductor structure of FIG. 1 where the layered stack is patterned, in accordance with an embodiment of the present invention;

FIG. 3 is a cross-sectional view of the semiconductor structure of FIG. 2 where spacers are formed adjacent the patterned layered stack and inter-layer dielectric (ILD) is deposited adjacent the spacers, in accordance with an embodiment of the present invention;

FIG. 4 is a cross-sectional view of the semiconductor structure of FIG. 3 where a top electrode is formed over the patterned layered stack, in accordance with an embodiment of the present invention;

FIG. 5 is a cross-sectional view of the semiconductor structure of FIG. 4 where the spacers and the ILD are omitted to highlight the segmented phase change memory structure, in accordance with an embodiment of the present invention;

FIG. 10 is a cross-sectional view of a semiconductor structure including a patterned layer stack with additional Ge—Sb—Te (germanium-antimony-tellurium or GST) elements, in accordance with another embodiment of the present invention.

Throughout the drawings, same or similar reference numerals represent the same or similar elements.

DETAILED DESCRIPTION

Figure 6:
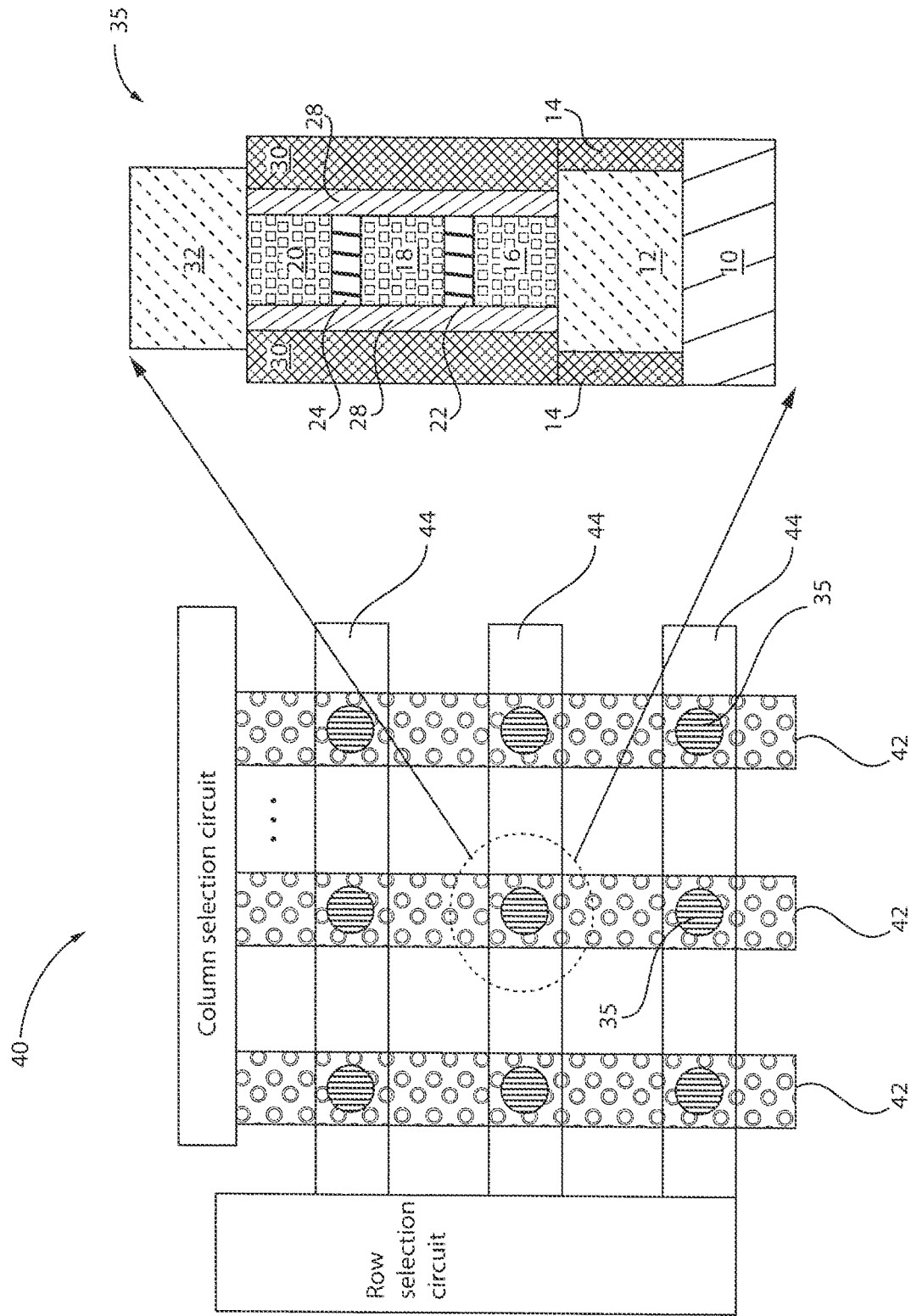
FIG. 6 is an exemplary 3×3 cross-point phase change memory (PCM) array incorporating the structure of FIG. 4, in accordance with an embodiment of the present invention.

Embodiments in accordance with the present invention provide methods and devices for dealing with element segregation issues of phase change elements by incorporating an electrically conductive and chemically stable material inside the phase change element. The term "element segregation" refers to elements that are spatially segregated or separated within a region. The electrically conductive and chemically stable material can be, e.g., titanium nitride (TiN), and the phase change element can be, e.g., a Ge—Sb—Te (germanium-antimony-tellurium or GST) material. All the phase change materials (PCMs) are the same in the PCM structures of the exemplary embodiments.

Embodiments in accordance with the present invention provide methods and devices for employing phase change based materials in memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a bottom electrode formed on a substrate and a layered stack formed over the bottom electrode, in accordance with an embodiment of the present invention.

A semiconductor structure 5 includes a bottom electrode 12 formed over a substrate 10. Inter-layer dielectric (ILD) 14 is deposited adjacent the bottom electrode 12. A layered stack is then formed over the bottom electrode 12. The layered stack can include alternating layers of Ge—Sb—Te (germanium-antimony-tellurium or GST) material 16, 18, 20, and metal nitride layers 22, 24. The metal nitride can be, e.g., titanium nitride (TiN). Additionally, a hardmask 26 can be deposited over and in direct contact with the top GST layer 20. In the exemplary embodiment, there are three GST layers 16, 18, 20 and two TiN layers 22, 24. However, the exemplary embodiments are not limited by this number of GST and TiN layers or segments. One skilled in the art can contemplate employing a plurality of TiN layers or segments to create or construct a plurality of GST layers or segments. For example, FIG. 10 below outlines a phase change memory (PCM) cell structure having four GST layers and three TiN layers.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. The substrate 10 can include other device structures (not shown) such as transistors, resistors, capacitors, diodes, isolation structures, contacts, wirings, dielectrics, etc.

The bottom electrode 12 can include a conductive material, such as Cu, Al, Ag, Au, Pt, W, etc. In some embodiments, the bottom electrode 12 can include nitrides such as TiN, TaN, Ta or Ru. In one embodiment, the bottom electrode 12 is TiN.

The ILD 14 can include any materials known in the art, such as, for example, porous silicates, carbon doped oxides, silicon dioxides, silicon nitrides, silicon oxynitrides, or other dielectric materials. The ILD 14 can be formed using any method known in the art, such as, for example, chemical vapor deposition, plasma enhanced chemical vapor deposition, atomic layer deposition, or physical vapor deposition. The ILD 14 can have a thickness ranging from about 25 nm to about 200 nm.

The dielectric material of layer 14 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The hardmask layer 26 can be a nitride, for example, a silicon nitride (SiN), an oxynitride, for example, silicon oxynitride (SiON), or a combination thereof. In one embodiment, the hardmask layer 26 can be silicon nitride (SiN), for example, $Si_3N_4$.

In one or more embodiments, the hardmask layer 26 can have a thickness in the range of about 20 nm to about 100 nm, or in the range of about 35 nm to about 75 nm, or in the range of about 45 nm to about 55 nm, although other thicknesses are contemplated.

In the present example, the phase change material layers 16, 18, 20 include a Ge—Sb—Te (germanium-antimony-tellurium or "GST") alloy. Alternatively, other suitable materials for the phase change material layers 16, 18, 20 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof. The non-limiting thickness range of each GST layer can be, e.g., from about 5 nm to about 20 nm. The non-limiting thickness range for each TiN layer can be, e.g., from about 2 nm to about 5 nm.

The phase change material layers 16, 18, 20 are configured to be substantially amorphous following back-end-of-line ("BEOL") semiconductor processing. In one example, the phase change material layers 16, 18, 20 can be deposited with a thickness that is less than or about 20 nm and a deposition temperature that is less than about 200° C. The phase change material layers 16, 18, 20 can be deposited by a physical vapor deposition ("PVD") (also referred to as "sputtering") process.

GST material 16, 18, 20 has a melting point of about 620° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 to 100 nanoseconds. As the GST material 16, 18, 20 quickly cools when the current is interrupted, the atoms of the GST do not have sufficient time to form an ordered crystalline state, and the amorphous phase of the GST material 16, 18, 20 is formed. To form the crystalline (low resistivity) phase, at least a portion of the material can be heated to a temperature of about 550° C., which is above the crystallization temperature and near, but below, the melting point of the GST material, by applying a relatively lower current through the GST material 16, 18, 20 between the electrodes for a sufficient amount of time (e.g., as little as about 30 nanoseconds) to allow the atoms of the GST material 16, 18, 20 to assume the long-range order associated with the crystalline phase, after which the current flowing through the material can be interrupted. The current passed through the phase change material to cause a phase change therein can be referred to as the "programming current."

FIG. 2 is a cross-sectional view of the semiconductor structure of FIG. 1 where the layered stack is patterned, in accordance with an embodiment of the present invention.

In various exemplary embodiments, the layered stack is patterned to form stack 25. The patterning results in a top surface 13 of the bottom electrode 12 being exposed. Additionally, the hardmask 26 remains as part of the stack 25.

FIG. 3 is a cross-sectional view of the semiconductor structure of FIG. 2 where spacers are formed adjacent the patterned layered stack and inter-layer dielectric (ILD) is deposited adjacent the spacers, in accordance with an embodiment of the present invention.

In various exemplary embodiments, spacers 28 are formed adjacent the stack 25 and an inter-layer dielectric (ILD) 30 is deposited adjacent the spacers 28. The spacers 28 extend along the sidewalls of the stack 25. The spacers 28 are in direct contact with the sidewalls of the stack 25, including the hardmask 26.

The spacers 28 can be formed by performing a deposition process, for example, a chemical vapor deposition process (CVD), followed by a directional etch process (e.g., reactive ion etch (RIE) to remove the spacer material from horizontal surfaces. The spacers 28 can include one layer or multiple layers of materials. For example, the spacers 28 can include silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof.

The thickness of the spacers 28 can generally vary and is not intended to be limited. In some embodiments, the thickness of the spacers 28 is in a range from about 3 to about 50 nm. In other embodiments, the thickness of the spacers 28 is in a range from about 10 to about 30 nm.

The dielectric material 30 can include any interlayer dielectric material (ILD) including inorganic dielectrics or organic dielectrics. The dielectric material 30 can be porous, non-porous or include regions and/or surfaces that are porous and other regions and/or surfaces that can be non-porous. Some examples of suitable dielectrics that can be used as the dielectric material 30 include, but are not limited to, silsesquioxanes, C doped oxides (e.g., organosilicates) that include atoms of Si, C, O and H, thermosetting polyarylene ethers, polyimides, polynorbornene, benzocyclobutene, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the dielectric material 30 has a dielectric constant that is less than silicon dioxide, e.g., less than about 4.0. In another embodiment, the dielectric material 30 that can be employed in the present invention has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of about 4.0.

The ILD 30 can be reduced by chemical-mechanical polishing (CMP) and/or etching. Therefore, the planarization process can be provided by CMP. Other planarization process can include grinding and polishing.

FIG. 4 is a cross-sectional view of the semiconductor structure of FIG. 3 where a top electrode is formed over the patterned layered stack, in accordance with an embodiment of the present invention.

In various exemplary embodiments, the hardmask 26 is etched, as well as top portions of the spacers 28 and ILD 30. Then a top electrode 32 is formed over and in direct contact with the layered stack. The top electrode 32 can include a conductive material, such as Cu, Al, Ag, Au, Pt, W, etc. In some embodiments, the top electrode 32 can include nitrides such as TiN, TaN, Ta or Ru. In one embodiment, the top electrode 32 is titanium/aluminum (TiN/Al)-containing alloy/TiN. The structure in FIG. 4 can be designated as structure 35.

FIG. 5 is a cross-sectional view of the semiconductor structure of FIG. 4 where the spacers and the ILD are omitted to highlight the segmented phase change memory structure, in accordance with an embodiment of the present invention.

Thus, the exemplary embodiments of the present invention provide a method and structure for minimizing element segregation in PCM structures by inserting chemically stable, and electrically conducting layer(s) 22, 24 in GST pillars, such that the element segregation can be confined locally in each small GST segment or portion 16, 18, 20. Inserting TiN layers or segments 22, 24 in GST aids to form segmented GST 16, 18, 20. TiN is electrically conductive but chemically stable. The term "chemically stable" can, in one instance, refer to the tendency of a material to resist change or decomposition due to internal reaction or due to action of air, heat, light, pressure, etc. Chemically stable, in another instance, can also refer to PCM materials that are impervious to chemical diffusion across a boundary. Chemically stable, in yet another instance, can refer to a compound's inability to react with other molecules or materials (e.g., TiN inability to react with GST). Therefore, the TiN segments 16, 18, 20 are chemically stable and confine element segregation locally in each small segment. Additionally, all the PCM materials are the same. One advantage of this configuration is that it is easier to reverse (repair) element segregation during a RESET (melting) operation because of the much shorter diffusion distance for elements in each segment to recover the uniform PCM composition. This will be further described below with reference to FIGS. 7-9.

FIG. 6 is an exemplary 3×3 cross-point phase change memory (PCM) array incorporating the structure of FIG. 4, in accordance with an embodiment of the present invention.

In various exemplary embodiments, the PCM structures 35 or 37 can be inserted into a crossbar array. The semiconductor structures 35, 37 represent a memory cell incorporated between a plurality of bit lines 42 and a plurality of word lines 44. Thus, the array 40 is obtained by perpendicular conductive wordlines (rows) 44 and bitlines (columns) 42, where a cell structure 35, 37 with PCM memory element exists at the intersection between each row and column. The cell structure 40 with resistive memory element can be accessed for read and write operations by biasing the corresponding wordline 44 and bitline 42. Each PCM cell 35, 37 can further include a selector, such as a transistor, a diode or a threshold switching device.

Figure 7:
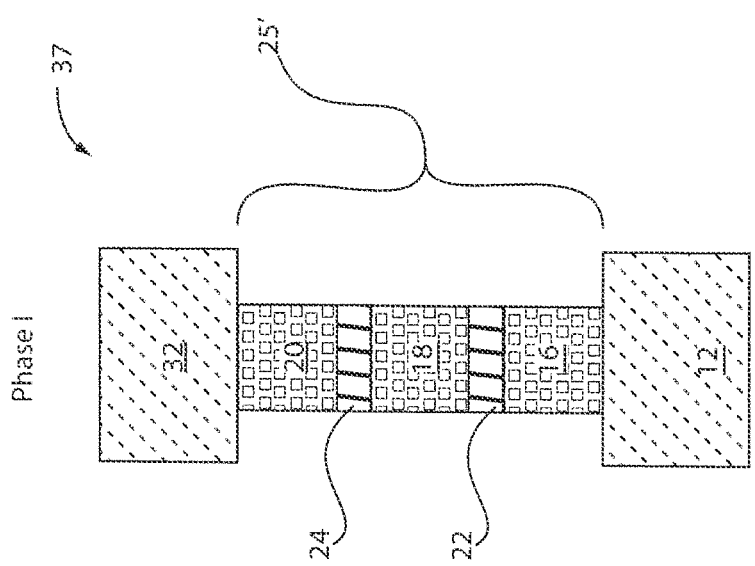
FIG. 7 is a cross-sectional view of the semiconductor structure of FIG. 4 where the PCM structure is in a first phase, in accordance with an embodiment of the present invention.

FIG. 7 is a cross-sectional view of the semiconductor structure of FIG. 4 where the PCM structure is in a first phase, in accordance with an embodiment of the present invention.

In a first phase, the structure 37 of FIG. 5 is employed to minimize or eliminate element segregation, that being, spatial separation of elements within a region. Regarding element segregation, during PCM operation, in one example where GST is employed, antimony (Sb) segregates to the cathode (e.g., of the bottom electrode), whereas tellurium/antimony (Te/Sb) segregates to the anode (e.g., top electrode). Such element segregation can cause endurance issues for PCM structures employing GST. Elemental segregation, in particular Sb enrichment in the switching region, can lead to poor data retention when the PCM cell can no longer be switched to the high resistance state or does not remain in the high resistance state since Sb-rich regions have low crystallization temperatures. To address such issues, in the exemplary embodiments, TiN segments 22, 24 can be inserted or incorporated or embedded into the GST material or pillars between the bottom electrode 12 and top electrode 32, such that GST segments 16, 18, 20 are formed between the TiN segments 22, 24. The GST segments 16, 18, 20 and TiN segments 22, 24 are formed in an alternating matter between the bottom electrode 12 and the top electrode 32. If the GST material is not segmented (as in conventional structures), then the diffusion distance is defined between the bottom electrode 12 and the top electrode 32, which can be a large distance. Thus, the elements Sb and Te can diffuse along a large, continuous, non-interrupted distance between the bottom electrode 12 and the top electrode 32. In a RESET operation, the element segregation would be difficult to recover or repair because of this large diffusion distance.

Figure 8:
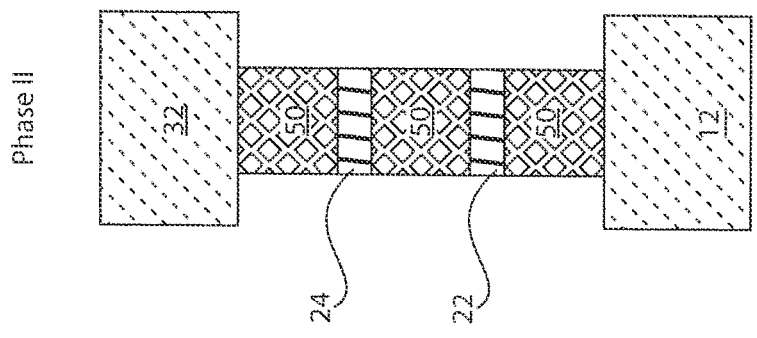
FIG. 8 is a cross-sectional view of the semiconductor structure of FIG. 7 where the PCM structure is in a second phase where element segregation takes place, in accordance with an embodiment of the present invention.

FIG. 8 is a cross-sectional view of the semiconductor structure of FIG. 7 where the PCM structure is in a second phase where element segregation takes place, in accordance with an embodiment of the present invention.

In a second phase, element segregation 50 can take place. The element segregation 50 is confined within each of the GST segments 16, 18, 20. For example, all the Sb of the GST does not travel to the bottom electrode 12. Instead, some of the Sb of the third GST segment 20 travels to the surface of the second TiN segment 24, some of the Sb of the second GST segment 18 travels to the surface of the first TiN segment 22, and some of the Sb travels to the bottom electrode 12. The TiN segments 22, 24 thus prevent all of the Sb to travel to the bottom electrode 12. Thus, the Sb travels a much shorter distance that is defined between the GST segments 16, 18, 20. The Sb does not have to travel from one end (from one electrode) to the other end (another electrode).

Figure 9:
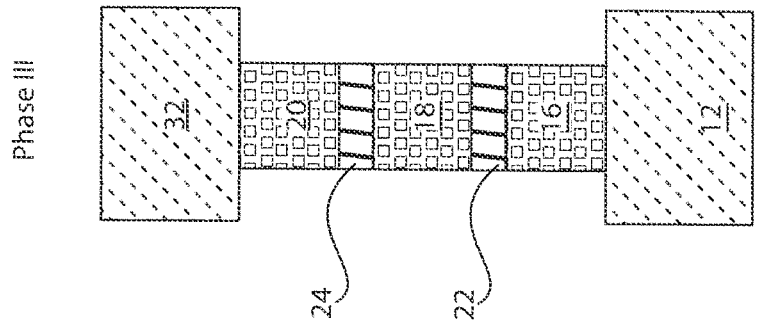
FIG. 9 is a cross-sectional view of the semiconductor structure of FIG. 8 where the PCM structure is in a third phase where element segregation is reversed during a melting operation, in accordance with an embodiment of the present invention.

FIG. 9 is a cross-sectional view of the semiconductor structure of FIG. 8 where the PCM structure is in a third phase where element segregation is reversed during a melting operation, in accordance with an embodiment of the present invention.

In a third phase, a RESET operation (or melting operation) takes place that reverses or repairs the element segregation 50. The RESET operation triggers the reversal of the element segregation 50 such that each GST segment transforms or converts back to its original state. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state.

As a result, the GST segments 50 can be designated as GST segments 16, 18, 20 because they have assumed their original or initial composition. As a result, element segregation can be fully reversed by shortening or lessening or reducing the diffusion distance. The diffusion distance can be shortened or lessened or reduced or cut down by inserting or incorporating TiN segments 22, 24 within select areas of the GST material to create or construct several GST segments. The GST segments can be of equal size. The shorter the diffusion distance, the easier it to recover the uniform PCM composition.

FIG. 10 is a cross-sectional view of a semiconductor structure including a patterned layer stack with additional Ge—Sb—Te (GST) elements, in accordance with another embodiment of the present invention.

The structure 60 includes a bottom electrode 62, a top electrode 64, and a GST/TiN stack formed therebetween. The stack includes a first GST segment 66, a second GST segment 68, a third GST segment 70, and a fourth GST segment 72. The GST segments 66, 68, 70, 72 are separated from each other by TiN segments 80, 82, 84. The GST segments 66, 68, 70, 72 can have a vertical thickness of about 10 nm and the TiN segments 80, 82, 84 can have a vertical thickness of about 2 nm. Of course, one skilled in the art can contemplate inserting four TiN segments or five TiN segments or more. There is no limitation to how many TiN segments can be inserted throughout the GST material or pillar. The vertical thickness of the entire GST material can be, e.g., about 40 nm in on example embodiment.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features, and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing element segregation of a phase change element (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system comprising:
    a semiconductor device, including:
        a bottom electrode;
        a layered stack disposed over the bottom electrode, the layered stack including a phase change material (PCM) having at least three PCM segments where a middle PCM segment is bounded by electrically conducting layers to prevent diffusion, each of the PCM segments having a same vertical thickness that is small enough such that material segregation is reversed during a reset operation; and
        a top electrode disposed over the layered stack; and
    a circuit that applies the reset operation on the semiconductor device by applying a current by a wordline or bitline that completely reverses material segregation.

2. The system of claim 1, wherein the PCM is Ge—Sb—Te (germanium-antimony-tellurium or GST).

3. The system of claim 1, wherein the electrically conducting layers are titanium nitride (TiN) segments.

4. The system of claim 1, wherein the bottom electrode, the layered stack, and the top electrode form a PCM cell incorporated into a crossbar array.

5. The system of claim 1, wherein an entire length of the layered stack is parallel to an upper surface of the bottom electrode.

6. The system of claim 1, wherein an entirety of the layered stack forms a single rectangle such that a bottom surface of the PCM directly contacting the bottom electrode is equal to a top surface of the PCM directly contacting the top electrode.

7. The system of claim 1, wherein the layered stack directly contacts spacers on opposed ends thereof.

8. The system of claim 7, wherein the spacers directly contact a top surface of the bottom electrode such that a bottom surface of the PCM is horizontally aligned with a bottom surface of the spacers.

9. The system of claim 7, wherein a bottommost surface of the top electrode is horizontally aligned with a top surface of the spacers.

10. A system comprising:
    a semiconductor structure, including:
        a bottom electrode;
        a layered stack disposed over the bottom electrode, the layered stack including a phase
        change material (PCM) having at least three PCM segments where a middle PCM segment is bounded by electrically conducting layers to prevent diffusion, each of the PCM segments having a same vertical thickness that is small enough such that material segregation is reversed during a reset operation; and
        a top electrode disposed over the layered stack, thereby minimizing element enrichment in a switching region of the phase change material; and
    a circuit that applies the reset operation on the semiconductor device by applying a current by a wordline or bitline that completely reverses material segregation.

11. The system of claim 10, wherein an entirety of a bottom surface of the PCM is planar.

12. The system of claim 10, wherein an entirety of a top surface of the PCM is planar.

13. The system of claim 10, wherein an entire length of the layered stack is parallel to an upper surface of the bottom electrode.

14. The system of claim 10, wherein an entirety of the layered stack forms a single rectangle such that a bottom surface of the PCM directly contacting the bottom electrode is equal to a top surface of the PCM directly contacting the top electrode.

15. The system of claim 10, wherein the layered stack directly contacts spacers on opposed ends thereof.

16. The system of claim 15, wherein the spacers directly contact a top surface of the bottom electrode such that a bottom surface of the PCM is horizontally aligned with a bottom surface of the spacers.

17. The system of claim 15, wherein the top electrode directly contacts a top surface of the spacers and a bottommost surface of the top electrode is horizontally aligned with a top surface of the spacers.

18. The system of claim 2, wherein each of the PCM segments has a same vertical thickness between 5 nm and 20 nm and wherein each of the electrically conducting layers has a same vertical thickness between 2 nm and 5 nm.

19. The system of claim 18, wherein each of the PCM segments has a vertical thickness of about 10 nm and wherein each of the electrically conducting layers has a vertical thickness of about 2 nm.

* * * * *